(12) United States Patent
Gan

(10) Patent No.: US 10,073,935 B2
(45) Date of Patent: Sep. 11, 2018

(54) SIMPLIFIED ZENER DIODE DC SPICE MODEL

(71) Applicant: SEMICONDUCTOR MANUFACTURING INTERNATIONAL (SHANGHAI) CORPORATION, Shanghai (CN)

(72) Inventor: Zhenghao Gan, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 298 days.

(21) Appl. No.: 14/988,610

(22) Filed: Jan. 5, 2016

(65) Prior Publication Data

US 2016/0203250 A1    Jul. 14, 2016

(30) Foreign Application Priority Data

Jan. 12, 2015   (CN) .......................... 2015 1 0014322

(51) Int. Cl.
*G06F 17/50*    (2006.01)

(52) U.S. Cl.
CPC ............................ *G06F 17/5036* (2013.01)

(58) Field of Classification Search
CPC ................................................... G06F 17/5036
USPC ............................................................ 703/14
See application file for complete search history.

(56) References Cited

U.S. PATENT DOCUMENTS 4,949,213 A * 8/1990 Sasagawa ........ H03K 17/08128
327/109
2010/0301194 A1* 12/2010 Patel ......................... G01J 1/18
250/208.2

* cited by examiner

*Primary Examiner* — Saif A Alhija
(74) *Attorney, Agent, or Firm* — Kilpatrick Townsend & Stockton LLP

(57) ABSTRACT

A circuit model of a Zener diode includes a forward bias diode, a reverse bias diode, a first resistor, a second resistor, and a voltage source. The forward bias diode and the first resistor are connected in series and form a first branch disposed between a positive terminal and a negative terminal. The voltage source, the reverse bias diode and the second resistor are connected in series and form a second branch, which is disposed between the positive terminal and the negative terminal and connected in parallel with the first branch. The circuit model can specifically describe the current-voltage characteristics of the Zener diode and significantly improve the accuracy of the circuit simulation.

14 Claims, 5 Drawing Sheets

SIMPLIFIED ZENER DIODE DC SPICE MODEL

CROSS-REFERENCES TO RELATED APPLICATIONS

The present application claims priority to Chinese patent application No. 201510014322.6, filed with the State Intellectual Property Office of People's Republic of China on Jan. 12, 2015, the content of which is incorporated herein by reference in its entirety.

FIELD OF INVENTION

The present invention relates generally to semiconductor technology. More particularly, embodiments of the present invention relate to a Zener diode circuit model and method of modeling the same.

BACKGROUND OF THE INVENTION

Compared with conventional diodes, Zener diodes have a lower breakdown voltage (also called Zener voltage), which is typically about 6 V. The low breakdown voltage of the Zener diode is the result of the heavily doped PN junction that produces the Zener breakdown through the tunneling mechanism. Within the heavily doped PN junction, under a reverse bias condition the conduction band and the valence band are very close so that electrons can tunnel directly from the p-region valence band to the n-region conduction band.

Zener diodes are semiconductor devices having a high resistance until the critical reverse breakdown voltage. At the critical breakdown point, the reverse resistance is decreased to a small value, the current increases while the voltage remains constant. Zener diodes are grouped according to their breakdown voltages. Because of the accurately determined and constant breakdown voltage, Zener diodes are typically used as voltage regulators or voltage reference elements. The typical application of Zener diodes is the clipper circuit where two Zener diodes have their cathodes connected to each other and their anodes connected across the input terminals of a circuit to limit the positive and negative voltage amplitudes of the circuit. FIG. 1A shows a clipper circuit having two Zener diodes $Zener_1$ and $Zener_2$ having their cathodes connected to each other and their anodes connected to the output terminals. FIG. 1B shows the voltage waveform where the negative amplitude is clipped by $Zener_1$ and the positive amplitude is clipped by $Zener_2$. The clipper circuit not only can be used for signal shaping, but also as overvoltage protection to prevent voltage spikes from occurring to electronic devices or components.

In order to predict the Zener diode performance and reliability in an application environment, the behavior of Zener diodes needs to be simulated. However, conventional Zener diode models do not accurately describe the reverse bias current and voltage of the Zener diode.

BRIEF SUMMARY OF THE INVENTION

Embodiments of the present invention provide a new Zener diode circuit model and modeling method that can accurately describe the electrical behavior of a Zener diode.

Embodiments of the present invention provide a circuit model of a Zener diode. The circuit model includes a forward bias diode, a reverse bias diode, a first resistor, a second resistor, and a voltage source. The forward bias diode and the first resistor are connected in series and form a first branch disposed between a positive terminal and a negative terminal. The voltage source, the reverse bias diode and the second resistor are connected in series and form a second branch, and the second branch is disposed between the positive terminal and the negative terminal and connected in parallel with the first branch.

In one embodiment, the voltage source is a voltage-dependent voltage source, and is represented through a current source and a resistor connected in parallel.

In one embodiment, a breakdown voltage of the voltage dependent voltage source is defined as VDVS, a current of the current source is defined as Ibv, a resistance value of the resistor is defined as Rbv, and VDVS, Ibv, and Rbv satisfy the relation: VDVS=Ibv*Rbv.

In one embodiment, the resistor in the voltage-dependent voltage source is a temperature dependent resistor configured to model a temperature-dependent breakdown voltage.

In one embodiment, the first branch is a first circuit model configured to model a forward bias current and a reverse bias current before a breakdown point (i.e., before the reverse bias reaches the breakdown voltage. The first circuit model comprises a plurality of parameters including a tunneling emission coefficient, a tunneling saturation current, and a tunneling current temperature coefficient for modeling a reverse bias current before a breakdown point.

In one embodiment, the second branch is configured to model a reverse bias current after a breakdown point.

In one embodiment, the circuit model also includes a switch configured to connect and disconnect the voltage source in the second branch.

Embodiments of the present invention also provide a method for modeling a Zener diode. The method includes providing an equivalent circuit model of the Zener diode. The equivalent circuit model of the Zener diode may include a forward bias diode, a reverse bias diode, a first resistor, a second resistor, and a voltage source. The forward bias diode and the first resistor are connected in series and form a first branch disposed between a positive terminal and a negative terminal, and the voltage source, the reverse bias diode and the second resistor are connected in series and form a second branch, the second branch is disposed between the positive terminal and the negative terminal and connected in parallel with the first branch. The method further includes simulating the equivalent circuit model using the first branch to model a forward bias current and a reverse bias current before a breakdown point (before the reverse bias reaches the breakdown voltage), and using the second branch to model a reverse bias current after the breakdown point (after the reverse bias reaches the breakdown voltage).

BRIEF DESCRIPTION OF THE DRAWINGS

For a more complete understanding of the present invention, and the advantages thereof, reference is now made to the following detailed description taken in conjunction with the accompanying drawings, in which.

DETAILED DESCRIPTION OF THE INVENTION

Embodiments of the present invention now will be described more fully hereinafter with reference to the accompanying drawings, in which embodiments of the invention are shown. The invention may, however, be embodied in many different forms and should not be construed as limited to the embodiments set forth herein.

The use of the terms "a", "an", etc. does not denote a limitation of quantity, but rather denote the presence of at least one of the referenced items. It will be understood that the terms "comprises", "comprising", "includes", "including" when used herein, specify the presence of stated features, integers, steps, operations, elements and/or components, but do not preclude the presence or addition of one or more other features, integers, steps, operations, elements and/or components. Furthermore, as used herein, the words "and/or" may refer to and encompass any possible combinations of one or more of the associated listed items. The use of the terms "first", "second", etc. do not denote any order, but rather the terms first, second, etc. are used to distinguish one element from another.

It is to be noticed that the terms "coupled to," "coupled with," "connected to," "connected with," should not ne interpreted as being restricted to direct connections only. Thus, the scope of the expression "a component A connected to a component B" should not be limited to components where an output of component A is directly connected to an input of component B. It means that there exists a path between an output of A to an input of B which may be a path including other components.

In the following description, numerous details are set forth to provide a thorough understanding of the present invention. However, those of skilled in the art will appreciate that the present invention may be implemented without such specific details. In other instances, well-known elements have been illustrated in schematic or block diagram form in order not to obscure the present invention in unnecessary detail.

SPICE (Simulation Program with integrated Circuit Emphasis) is one of the most commonly used circuit simulation programs. SPICE simulation models have been widely used in electronic design for nonlinear dc and transient analysis. For circuit simulation, a model of a component must first be generated. A diode is one of the important semiconductor devices widely used in a semiconductor integrated circuit design. Thus, an accurate diode SPICE model plays a key role in the design of an integrated circuit device.

Figure 1A:
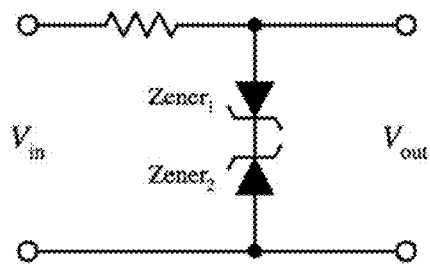
FIG. 1A is an equivalent circuit diagram of a clipper circuit, as known in the art.
Figure 1B:
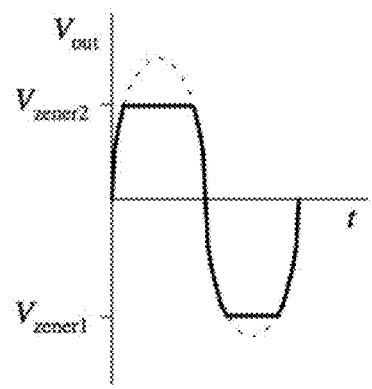
FIG. 1B is an output waveform of the clipper circuit of FIG. 1A.
Figure 2A:
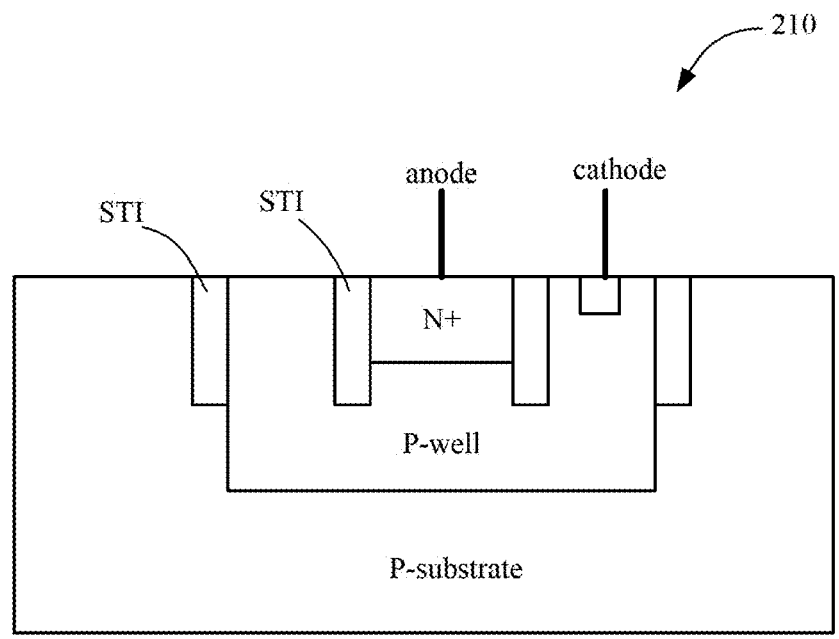
FIG. 2A is a cross-sectional view of a conventional P-well/N+ STI diode structure.

FIG. 2A schematically shows a structure 210 of a conventional P-well/N+ diode structure including a P-substrate, a P-well in the P-substrate, a P+ region, and a N+ region in the P-well. Structure 210 also includes shallow trench structures (STI) disposed between the P-well and the P+ region and STI disposed between the P-well and the P-substrate. The P+ region is connected to an anode, and the N+ region is connected to a cathode.

Figure 2B:
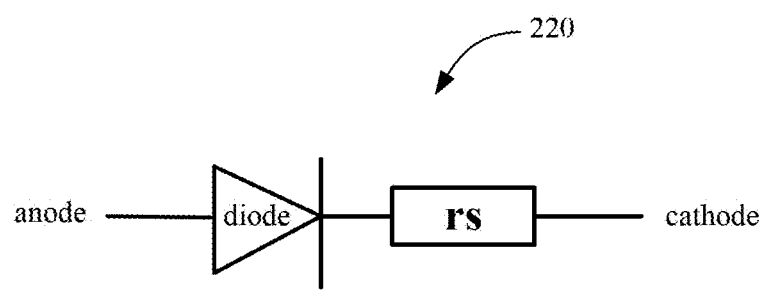
FIG. 2B is a simulation model of the circuit diagram of the P-well/N+ STI diode of FIG. 2A.

FIG. 2B is a simulation model circuit 220 of the diode structure 210 of FIG. 2A. The model circuit 220 includes a diode and a resistor "rs" connected in series between the anode and the cathode. The current id flowing through the diode can be represented by the expression id=IS·[exp((vd−id·rs/(N·vt))−1], where vd is the voltage between the anode and the cathode, IS represents the ideal saturation current, N is the ideal factor, and vt is the thermal voltage and equal to 26 mV.

The inventor discovered that the simulation model circuit 220 does not accurately describe the reverse bias current-voltage (IV) characteristics of a Zener diode.

Figure 2C:
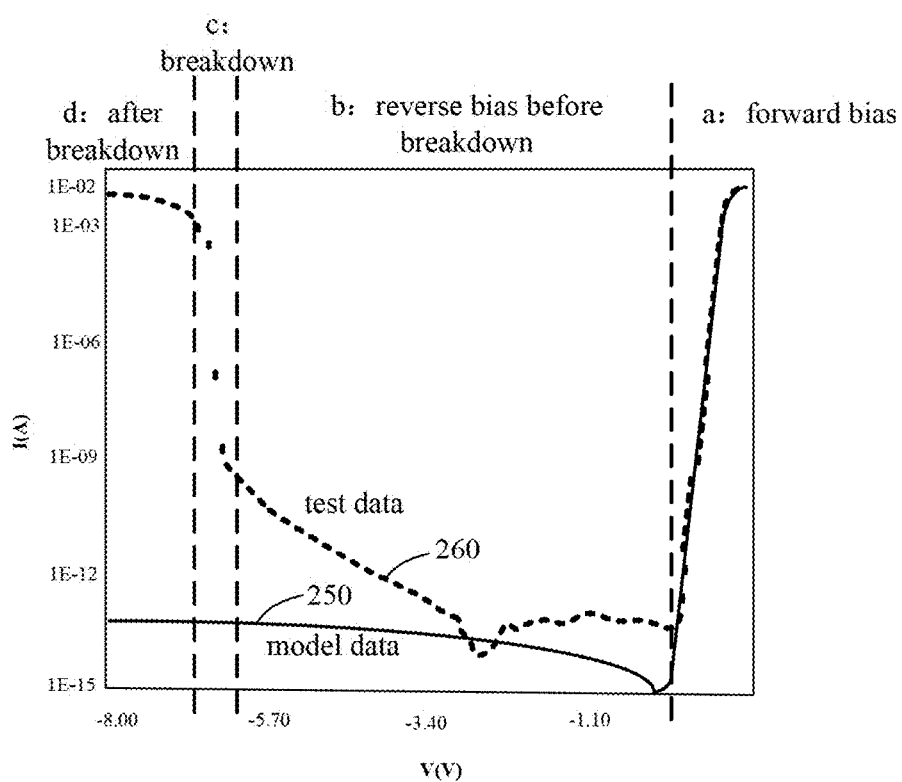
FIG. 2C is a graph showing a simulated IV curve and a measured IV curve of a Zener diode, as known in the art.

FIG. 2C shows a simulated IV curve 250 and a measured IV curve 260 of a Zener diode of FIG. 2B. As shown in FIG. 2C, the dotted line represents the measured currents and the solid line presents the simulation currents of a Zener diode under different voltage bias conditions. The x-axis represents the voltage across the diode and the y-axis represents the current flowing through the diode in a logarithmic scale. FIG. 2C is divided into 4 regions: region "a" is the model circuit in forward bias; region "b" is the model circuit in reverse bias before breakdown; region "c" is the model circuit when the breakdown occurs; and region "d" is the model circuit after the breakdown. As shown in FIG. 2C, the measured IV curve 260 matches the simulated IV curve in the forward bias region "a," whereas the simulated IV curve 250 significantly underestimates the measured IV curve in the reverse bias region "b" of the Zener diode before the breakdown. Thus, there is a need for an improved model circuit of a Zener diode.

Figure 3:
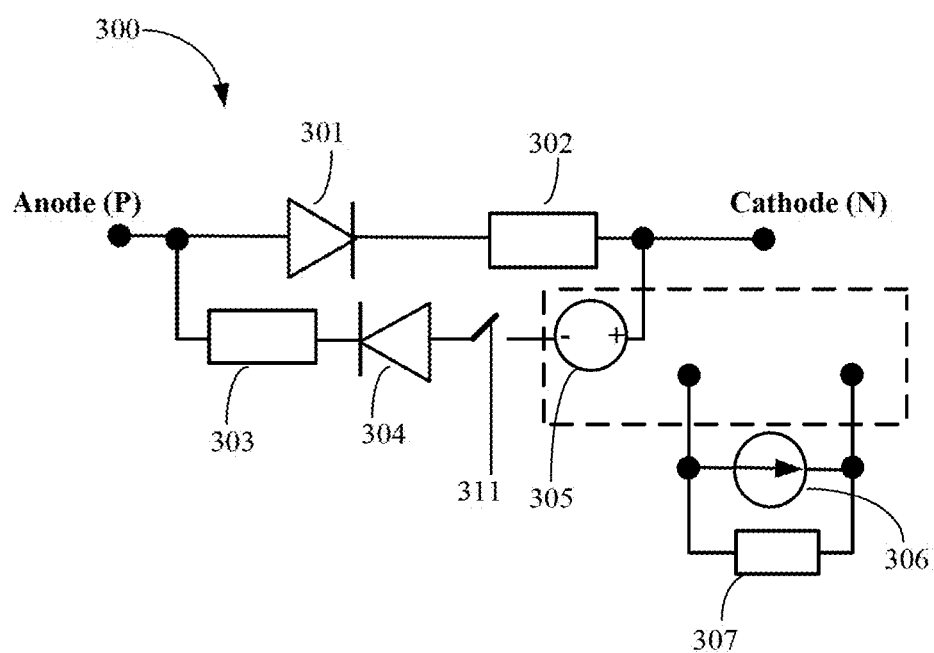
FIG. 3 schematically shows a circuit model of a Zener diode according to an embodiment of the present invention.

FIG. 3 schematically shows a model circuit 300 of a Zener diode according to an embodiment of the present invention. Model circuit 300 includes a forward biased diode 301, a reverse biased diode 304, a first resistor 302, a second resistor 303, and a voltage source 305. The forward bias diode 301 is connected in series with the first resistor 302 to form a first branch disposed between a positive terminal (P) and a negative terminal (N). The voltage source 305 is connected to the reverse bias diode 304 and the second resistor 303 in series between the positive terminal (P) and the negative terminal (N) to form a second branch. The second branch is connected in parallel to the first branch.

In an embodiment, the forward bias diode 301 and the first resistor 302 correspond to the respective diode and resistor "rs" of the equivalent model circuit of a conventional diode. The conventional diode may be a STI diode.

Typically, the first branch is used as the model circuit of the forward bias current and the reverse bias current before the breakdown. The SPICE model parameters of a tunneling emission coefficient (ntun), tunneling saturation current (jtun), and tunneling current temperature coefficient (xtitun) are still not suitable for modeling and simulation of the reverse bias current before breakdown.

As described above, when simulating a Zener diode with the model circuit of FIG. 2B, the forward bias IV curve can be accurately described whereas the reverse bias IV curve is not accurately described. Thus, a switch 311 may be added to the branch of the voltage source 305 of the model circuit 300 to control the connection of the voltage source 305 to the branch. The switch 311 may be turned off (open) when the Zener diode is forward biased, so that the Zener diode model circuit only includes the forward bias diode 301 and the first resistor 301 that is similar to the conventional diode model circuit shown in FIG. 2B. The switch 311 is turned on (closed) when the Zener diode is reverse biased. It is understood that the switch 311 is only shown for description purposes and may not be necessarily since the first branch is automatically the main contributor to the Zener diode under forward bias, whereas the second branch is the main contributor to the Zener diode under reverse bias.

Specifically, in the embodiment, the second branch including the voltage source 305, the reverse bias diode 304, and the second resistor 303 is added to implement the simulation of the reverse bias IV curve of the model circuit. The voltage source 305 is connected in series with the reverse bias diode 304 and the second resistor 303 to form the second branch that is disposed between the positive terminal (P) and the negative terminal (N). The second branch is connected in parallel to the first branch. The second branch may be used as the model circuit of the reverse bias current after the breakdown.

In an exemplary embodiment, the voltage source 305 is the voltage-dependent voltage source (VDVS). The voltage source 305 of the VDVS can be realized through a current source 306 connected in parallel with a resistor 307.

The voltage of the voltage source 305 of the VDVS may be represented by the following expression: VDVS=Ibv*Rbv, where Ibv is the current of the current source 306, and Rbv is the resistance value of the resistor 307.

Because the breakdown voltage is temperature dependent, the resistor 307 is a temperature dependent resistor to represent the temperature dependent breakdown voltage according to some embodiments of the present invention.

Embodiments of the present invention also provide a method of modeling a Zener diode. The method may include:

Step 1: establishing an electrical equivalent circuit model of a Zener diode. The Zener diode circuit model includes a forward bias diode, a reverse bias diode, a first resistor, a second resistor, and a voltage source. The forward bias diode and the first resistor are connected in series and form a first branch disposed between a positive terminal and a negative terminal. The voltage source, the reverse bias diode, and the second resistor form a second branch, which is connected in parallel with the first branch.

Step 2: simulating the equivalent circuit model obtained in step 1. The first branch is used for modeling the forward bias current and the reverse bias current before a breakdown point, and the second branch is used for modeling the reverse bias current after the breakdown point.

Illustratively, the voltage source is a voltage-dependent voltage source. The voltage of the voltage-dependent voltage source is realized through a current source connected in parallel with a resistor. The voltage source of the voltage-dependent voltage source can be represented by the expression VDVS=Ibv*Rbv, where VDVS is the voltage of the voltage source representing the breakdown voltage, Ibv is the current of the current source, and Rbv is the resistance value of the resistor connected in parallel with the current source.

Because the current source is connected in parallel with the resistor which is temperature dependent, the breakdown voltage is thus, temperature dependent, i.e., the breakdown voltage of the expression VDVS=Ibv*Rbv can accurately represent the temperature-dependent breakdown voltage.

In an exemplary embodiment, the first branch is used for modeling the forward bias current and the reverse bias current before the breakdown. Because the first branch is similar to the conventional diode model, the SPICE model parameters of tunneling emission coefficient (ntun), tunneling saturation current (jtun), and tunneling current temperature coefficient (xtitun) are suitable for modeling the reverse bias current before breakdown.

Figure 4:
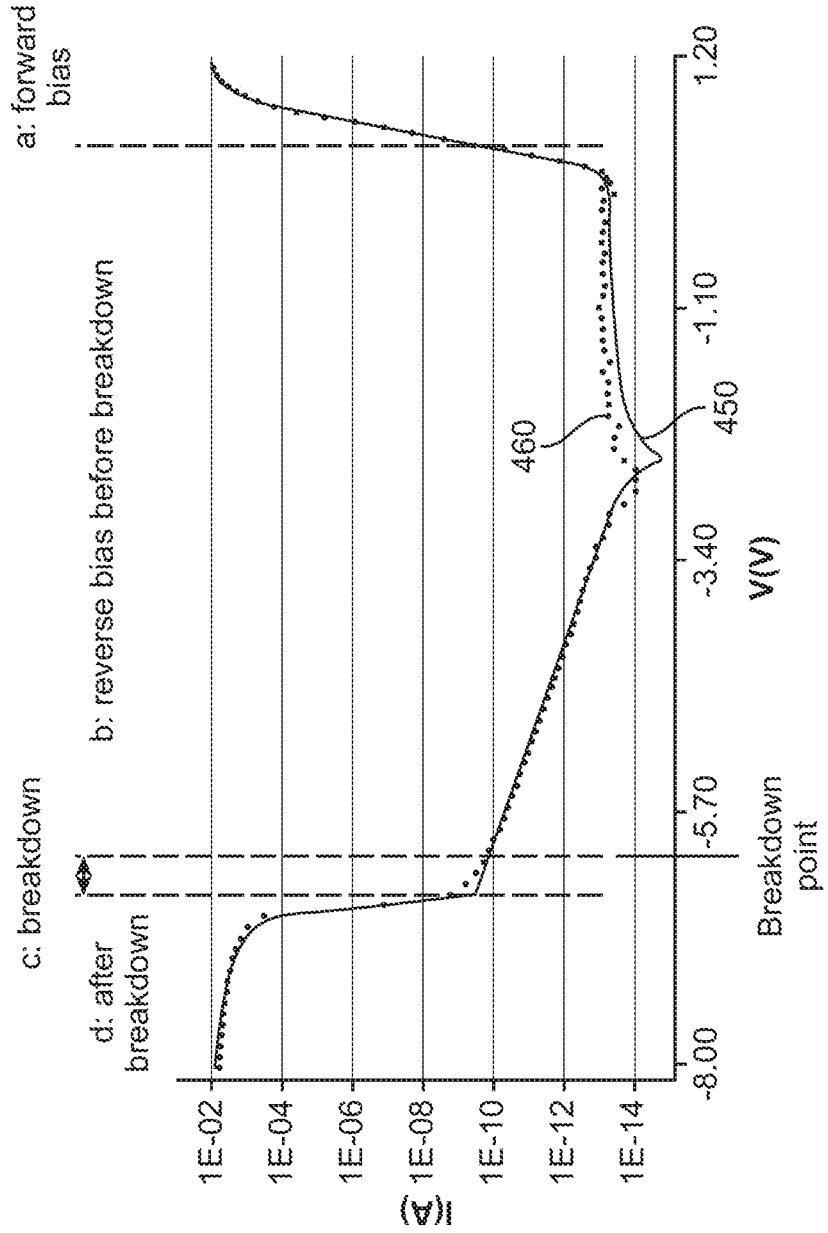
FIG. 4 is a graph showing a simulated IV curve and a measured IV curve of the Zener diode model of FIG. 3.

The current-voltage characteristics of a Zener diode can be accurately described using the circuit model of the present invention. FIG. 4 is a graph showing a simulated current-voltage (IV) curve 450 and a measured IV curve 460 of the Zener diode model circuit of FIG. 3. Referring to FIG. 4, the dotted line represents the measured currents and the solid line presents the simulation currents of the Zener diode under different voltage bias conditions. The x-axis represents the voltage across the diode and the y-axis represents the current flowing through the diode in a logarithmic scale. FIG. 4 is divided into 4 regions: region "a" is the model circuit in a forward bias condition; region "b" is the model circuit in a reverse bias condition before the breakdown; region "c" is the model circuit when the breakdown occurs; and region "d" is the model circuit after the breakdown. As shown in FIG. 4, the measured IV curve substantially matches the simulated IV curve in all the four regions.

According to the present invention, the circuit model has been simulated using the first branch including the diode 301 and the resistor 302 connected in series before the breakdown point. The first branch of the circuit model is the main contributor to the modeling of the forward bias current and the reverse bias current before the breakpoint point, i.e., regions (a) and (b) of FIG. 4. The second branch substantially contributes to the modeling of the reverse bias current after the breakdown point, i.e., regions (c) and (d) of FIG. 4. It is to be understood that the switch 311 is actually not necessary as the first branch automatically is the main contributor to the Zener diode model under forward bias, and the second branch is the substantial contributor to the Zener diode model under reverse bias.

In summary, embodiments of the present invention provide a simple model circuit of a Zener diode that is easy to be implemented. The model circuit can specifically describe the current-voltage characteristics of a Zener diode and significantly improve the accuracy of the circuit simulation.

The present invention has been described by the above embodiments, it is to be understood that the embodiments described above are illustrative and not restrictive. It is to be understood that the embodiments are not limited to the disclosed embodiments, and are intended to cover various modifications and equivalent arrangements included within the spirit and scope of the appended claims.

What is claimed is:

1. A device comprising:
    a forward bias diode;
    a reverse bias diode;
    a first resistor;
    a second resistor; and
    a voltage source, wherein:
    the forward bias diode and the first resistor are connected in series and form a first branch disposed between a positive terminal and a negative terminal, the first branch comprising a plurality of parameters including a tunneling emission coefficient, a tunneling saturation current, and a tunneling current temperature coefficient for modeling a reverse bias current before a breakdown point, and
    the voltage source, the reverse bias diode and the second resistor are connected in series and form a second branch, the second branch being disposed between the positive terminal and the negative terminal and connected in parallel with the first branch.

2. The device of claim 1, wherein the voltage source is a voltage-dependent voltage source.

3. The device of claim 2, wherein the voltage dependent voltage source is modeled through a current source and a resistor connected in parallel.

4. The device of claim 3, wherein a breakdown voltage of the voltage dependent voltage source is defined as VDVS, a current of the current source is defined as Ibv, a resistance value of the resistor is defined as Rbv, and VDVS, Ibv, and Rbv satisfy the relation:

$$VDVS = Ibv * Rbv.$$

5. The device of claim 3, wherein the resistor is a temperature dependent resistor configured to model a temperature-dependent breakdown voltage.

6. The device of claim 1, wherein the first branch is further configured to model a forward bias current before the breakdown point.

7. The device of claim 1, wherein the second branch is configured to model a reverse bias current after the breakdown point.

8. The device of claim 1, further comprising a switch configured to connect and disconnect the voltage source in the second branch.

9. A method for modeling a Zener diode, the method comprising:
providing a device comprising a forward bias diode, a reverse bias diode, a first resistor, a second resistor, and a voltage source, wherein the forward bias diode and the first resistor are connected in series and form a first branch disposed between a positive terminal and a negative terminal, the first branch comprising a plurality of parameters including a tunneling emission coefficient, a tunneling saturation current, and a tunneling current temperature coefficient for modeling a reverse bias current before a breakdown point, and the voltage source, the reverse bias diode and the second resistor are connected in series and form a second branch, the second branch is disposed between the positive terminal and the negative terminal and connected in parallel with the first branch; and
operating the device using the first branch to model a forward bias current and a reverse bias current before the breakdown point, and using the second branch to model a reverse bias current after the breakdown point.

10. The method of claim 9, wherein the voltage source is a voltage-dependent voltage source.

11. The method of claim 10, wherein the voltage dependent voltage source is modeled through a current source and a resistor connected in parallel.

12. The method of claim 11, wherein a breakdown voltage of the voltage dependent voltage source is defined as VDVS, a current of the current source is defined as Ibv, a resistance value of the resistor is defined as Rbv, and VDVS, Ibv, and Rbv satisfy the relation:

$$VDVS = Ibv * Rbv.$$

13. The method of claim 11, wherein the resistor is a temperature dependent resistor configured to model a temperature-dependent breakdown voltage.

14. The method of claim 9, wherein the second branch is configured to model a reverse bias current after the breakdown point.

* * * * *